United States Patent

Lin

[11] Patent Number: 6,091,593
[45] Date of Patent: Jul. 18, 2000

[54] EARLY TRIGGER OF ESD PROTECTION DEVICE BY A NEGATIVE VOLTAGE PUMP CIRCUIT

[75] Inventor: Shi-Tron Lin, Hsinchu, Taiwan

[73] Assignee: Winbond Electronics Corp., Taiwan

[21] Appl. No.: 08/956,271

[22] Filed: Oct. 22, 1997

[51] Int. Cl.[7] .................................................. H02H 3/22
[52] U.S. Cl. ........................... 361/111; 361/56; 361/91.2; 361/91.3; 361/91.5
[58] Field of Search ............................ 361/56, 111, 91.1, 361/91.2, 91.3, 91.5

[56] References Cited

U.S. PATENT DOCUMENTS

| | | | |
|---|---|---|---|
| 4,503,448 | 3/1985 | Miyasaka | 357/23 |
| 5,218,222 | 6/1993 | Roberts | 257/362 |
| 5,272,371 | 12/1993 | Bishop et al. | 257/362 |
| 5,290,724 | 3/1994 | Leach | 437/51 |
| 5,399,928 | 3/1995 | Lin et al. | 327/434 |
| 5,508,224 | 4/1996 | Jang | 437/60 |
| 5,508,649 | 4/1996 | Shay | 327/318 |
| 5,545,910 | 8/1996 | Jang | 257/362 |
| 5,559,659 | 9/1996 | Strauss | 361/56 |
| 5,838,146 | 11/1998 | Singer | 323/270 |
| 5,852,541 | 12/1998 | Lin et al. | 361/111 |

OTHER PUBLICATIONS

A. Amerasekera, et al., Substrate Triggering and Salicide Effects on ESD Performance and Protection Circuit Design in Deep Submicron CMOS Processes, IEDM–95, pp. 547–550.

A. Amerasekera, et al., ESD in Silicon Integrated Circuits, John Wiley & Sons, pp. 40–48 and 68–72 (No Date).

*Primary Examiner*—Michael J. Sherry
*Attorney, Agent, or Firm*—Proskauer Rose LLP

[57] ABSTRACT

A transient voltage pump is provided to generate a negative voltage pulse for triggering turn-on of an ESD protection device. As VDD-to-VSS voltage increases rapidly in the initial ESD event, the voltage across the ESD protection device is larger than the trigger voltage of the ESD device while the ESD voltage is still at substantially lower voltage. These negative voltage pulses are used to earlier trigger the NMOS transistor before the ESD transient voltage actually reaches the trigger voltage. The present invention improves the ESD performance of an ESD protection device, such as a MOSFET or bipolar transistor, which is provided for protecting the power bus or IC pins during an ESD event.

33 Claims, 4 Drawing Sheets

EARLY TRIGGER OF ESD PROTECTION DEVICE BY A NEGATIVE VOLTAGE PUMP CIRCUIT

FIELD OF INVENTION

The present invention relates to ESD protection circuit on a semiconductor device.

BACKGROUND OF THE INVENTION

In order to protect the integrated circuit from damages possibly caused by electrostatic discharge (ESD) event, different efforts have been made by the industries. Transistors, such as grounded-gate NMOS (GGNMOS), gate-coupled NMOS (GCNMOS), field-oxide MOSFET, output buffer transistors, or bipolar transistors, have been commonly used as primary ESD protection elements for integrated circuits. A diode also can be used as an ESD protection device by avalanche breakdown during the ESD event.

For ESD protection of an IC pin or a power bus, GGN-MOS (grounded-gate NMOS) or GCNMOS (gate-coupled NMOS) can be used as the primary ESD protection. The drain of the NMOS transistor is connected to VDD or the IC pin, while the source of the NMOS transistor is connected to VSS. The gate is either grounded (GGNMOS), or coupled to VDD by a capacitor and to VSS by a resistor (GCNMOS). A bipolar transistor or other ESD protection circuit can also be used for ESD protection. The VDD to VSS voltage difference may increase rapidly to higher than 10 volts during an ESD event such as the following situations: (i) positive voltage stress of VDD pin to VSS pin, (ii) negative voltage stress of VSS pin to VDD pin, (iii) positive voltage stress on an input or I/O pin while the pin is connected to a pull-up (p+/nwell) diode or a pull-up PMOS, (iv) negative voltage stress on an input or I/O pin while the pin is connected a pull-down (n+/pwell) diode or a pull-down NMOS, or (v) positive voltage stress on one IC pin to another IC pin.

The ESD protection of a MOSFET (bipolar transistor as well) heavily depends on the triggering of a snap-back mechanism for conducting large amount of ESD current between the drain and source of MOSFET. To start, the high electric field at the drain-substrate junction causes impact ionization with generation of both minority and majority carriers. The minority carriers is collected at the drain (anode), while the majority carriers flow toward the substrate or pwell contact (cathode) causing a local potential build up in the pwell. When the local substrate potential is 0.8V higher than the adjacent n+ source potential, the source-substrate junction becomes forward biased. The forward-biased source-substrate junction injects minority carriers into the pwell. Some of those injected minority carriers are recombined in the substrate while the rest of them reached the drain-substrate junction to further enhance the impact ionization. And due to a continuous loop (positive feedback), the MOSFET gets into a low impedance (snapback) state to conduct large amount of ESD current.

In an ESD event, the triggering of an NMOSFET or bipolar ESD protection device is typically initiated by the avalanche breakdown of the reverse-biased diffusion-substrate junction (drain-substrate or collector-substrate junction). The trigger voltage is typically around 12 or 13 volt. It is of great advantage to lower the trigger voltage of a MOSFET (or bipolar transistor) during an ESD event. As the ESD protection occurs sooner, the transient voltage imposed on the I/O and internal circuit is lower which offers better overall ESD protection. When minority carriers (electrons) are present in the reverse-biased diffusion-substrate junction, due to carrier multiplication from impact ionization, the trigger voltage is reduced and the integrated circuit can be better protected in an ESD event.

The prior art, "ESD in Silicon Integrated Circuits" by A. Amerasekera and C. Duvvury, Chap. 3 and Chap. 4, John Wiley & Sons, 1995, hereinafter Ref. 1, describes in details the mechanism of ESD protection circuit. Among prior arts approaches, U.S. Pat. No. 5,366,908 discloses a process for fabricating a MOS device with protection against ESD. The Ref. 1 and U.S. Pat. No. 5,272,371 use a trigger device with a lower trigger voltage than that of the ESD protection device. Once the trigger device reaches avalanche breakdown, lots of carriers are generated and some of them flow in the substrate to induce the trigger of the ESD protection device. Usually, additional implant or a special process recipe is needed, as disclosed in the U.S. Pat. No. 5,272,371, to adjust the trigger voltage of the trigger device, such that it is lower than the trigger voltage of the ESD protection device. The U.S. Pat. No. 5,218,222 discloses another ESD protection circuit which applicable for output and input pads. The U.S. Pat. No. 5,290,724 discloses another process for forming ESD protection circuit. The U.S. Pat. No. 5,508,224 discloses another process for forming ESD protection circuit. The U.S. Pat. No. 5,545,910 discloses another ESD protection circuit. Another prior art "Substrate Triggering and Salicide Effects on ESD Performance and protection Circuit Design in Deep Submicron CMOS Processes" presented by Amerasekera et al. in 1995 IEDM conference paper, lowers the trigger voltage of an ESD protection device by forward biasing a pull-up diode (p+/n-well diode) connected between the input pad and VDD bus. Through the reverse-biased nwell-to-pwell junction, some carriers are collected into the pwell to help triggering the ESD protection device in the pwell. Usually, a method of this nature creates a parasitic SCR (pnpn) path with a reverse-biased nwell/pwell junction, and the latch-up immunity issue therewith needs special design considerations.

U.S. Pat. No. 5,399,928 describes a method of generating negative voltage from a positive voltage source. The negative voltages are typically generated during IC operation and is used for back-bias generator or for the erase operation of Flash memory cells. U.S. Pat. No. 5,625,544 describes a voltage pump which generates a train of high voltage pulse with voltage values higher than Vdd during circuit operation. The pumped high voltage is used for EPROM erasing. U.S. Pat. No. 5,352,936 discloses technique by which high voltage charge pump is constructed by low voltage CMOS devices.

SUMMARY OF THE INVENTION

The present invention relates to reduction of the trigger voltage of an ESD protection device through the generation of a negative voltage pulse by a voltage pump during earlier period of an ESD transient, such as the positive voltage stress of an IC pin (Input, I/O or VDD pin) to the VSS pin.

The negative voltage generated together with the ESD transient voltage constitute a large voltage difference across the primary ESD protection device to trigger the primary ESD protection device during earlier period of the ESD transient.

BRIEF DESCRIPTIONS OF THE APPENDED DRAWINGS

DETAILED DESCRIPTIONS OF THE PREFERRED EMBODIMENTS

Figure 1:
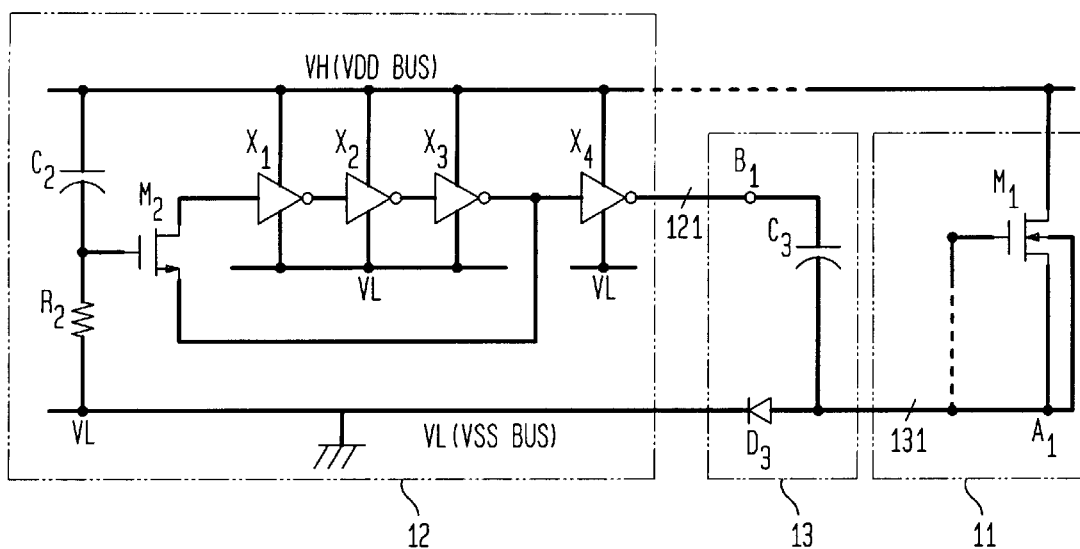
FIG. 1 shows a first preferred embodiment of the invention.

As shown in FIG. 1, the first embodiment of the invention includes an ESD protection circuit 11, an oscillation circuit 12, and a voltage pump 13. The VH of the oscillation circuit 12 is electrically coupled to the VDD bus, or alternatively, electrically coupled to an IC pin via a pull-up device. The VL of the oscillation circuit 12 is electrically coupled to VSS. During a positive VDD-to-VSS or pin-to-VSS ESD event, the voltage difference of the VH and VL applied to the oscillation circuit 12 increases rapidly along with the ESD transient voltage. As a consequence, the amplitude of the oscillating signal 121 also increases rapidly during the initial ESD transient. The ESD protection circuit 11, which may be an ESD protection device for the power bus, an input pin or an I/O pin, is embodied by a NMOSFET M1 shown in FIG. 1.

In particular, the oscillation circuit 12 is constituted by a ring oscillator which is a serial connection of an odd number of (at least one) inverters. In shown example, inverters X1, X2, X3 are employed. In a preferred embodiment, an optional buffer X4 may be used to improve the drive strength of the oscillating signal 121. The oscillation circuit 12 further includes a delay switch consisting of a switch M2, a capacitor C2 and a resistor R2. The delay switch functions to turn on the oscillation circuit 12 for at least a time period during the ESD event. The delay switch includes a switch M2 having an input node, an output node and a control node, wherein the input node (source) connects to the output terminal of the inverter X3, the output node (drain) connects to an input terminal of the inverter X1. The delay switch includes an RC circuit which has a resistor R2 and a capacitor C2 with one common joint terminal connected to the control node of the switch M2. The control node of M2 is coupled to VH through the capacitor C2, and coupled to VL through the resistor R2. Among other choices, the R-C time constant may be roughly 20 ns, which enables the oscillator circuit 12 to oscillate for at least around 10 ns, but not much longer than 100 ns, during an ESD transient. Since a powering-up event typically takes longer, or much longer, than micro-seconds, the control node of M2 remains at a much lower voltage than the threshold voltage required to turn on M2. Therefore, the oscillator circuit 12 does not oscillate during normal IC operation or during powering up. The oscillation circuit mentioned above functions only during an ESD event, but not during normal operation nor powering up. This is important for power-saving reason as well as to avoid unwanted triggering of ESD protection circuits during normal IC operation.

During an ESD event, the output terminal of the oscillation circuit 12 generates an oscillation signal 121. The voltage pump 13, responsive the oscillation signal 121, generates a voltage signal 131 which includes a negative voltage pulses at the node A1 during an ESD event.

Figure 3:
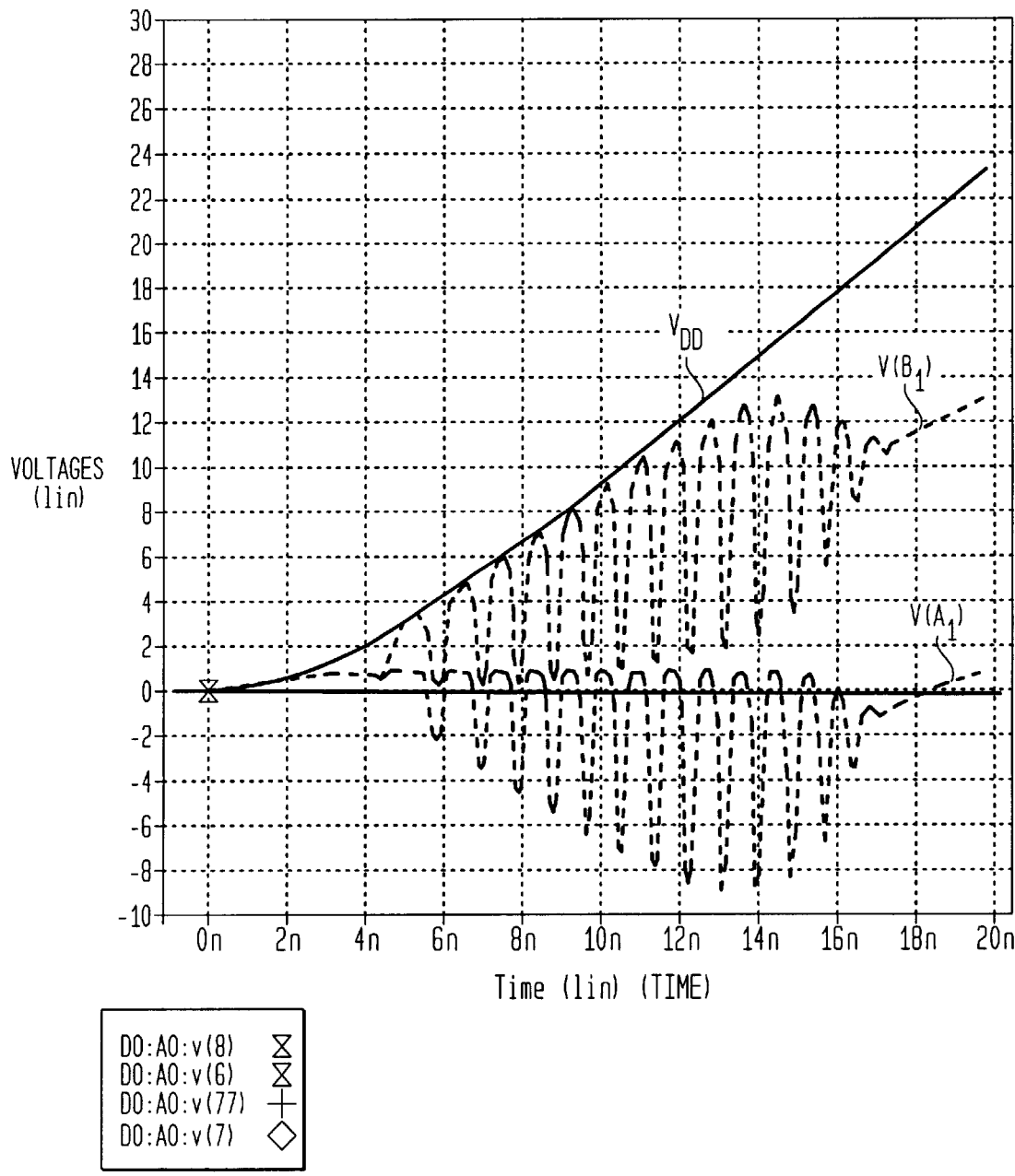
FIG. 3 shows signal variation at respective nodes of the first embodiment of the invention during an FSD event.

The voltage pump 13 includes a capacitor C3 and a voltage claming device D3. The capacitor C3 is used to couple the oscillating signal 121 to a voltage clamping device D3 as shown. As an embodiment, a p+/nwell diode with the nwell tied to the Vss is used as the voltage clamping device. The output signal 131 at the node A1 is therefore clamped to an upper positive value, say, 0.8v during the upward transition of the oscillating signal 121, as shown in FIG. 3. On the other hand, due to the pumping effect offered by the capacitor C3, the voltage signal 131 goes down to a negative voltage level during the downward transition of the oscillating signal 121. Therefore, the provided voltage pump 13 serves as a negative voltage pulse generator during the ESD event. The simulated voltage waveform, during a 2.5 KV human body model with 1nF power-bus capacitance, is shown in FIG. 3.

Figure 5:
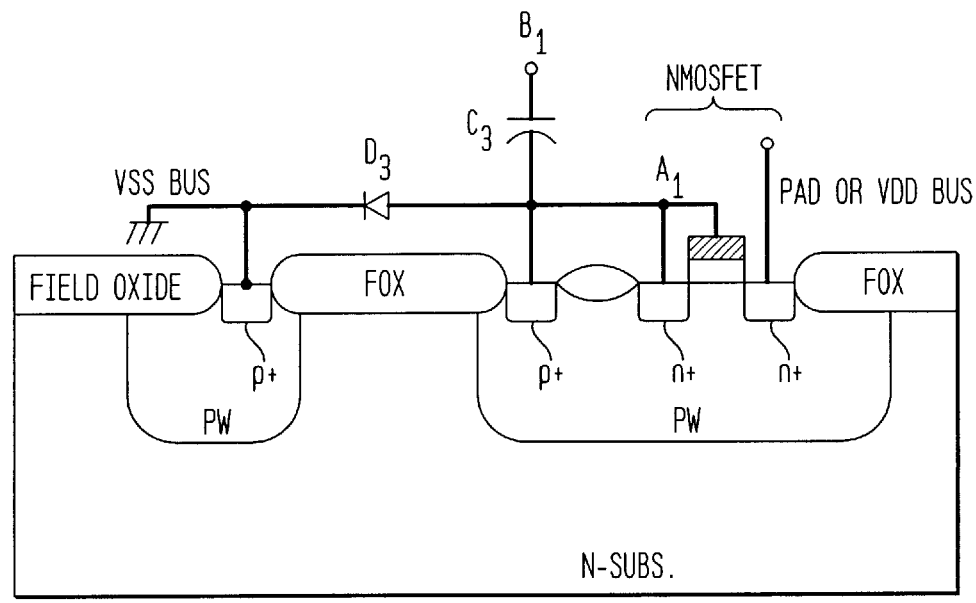
FIG. 5 shows circuit in FIG. 1 in a partial process view and a partial schematic view.

Due to the arrangement of the first embodiment, voltage difference of (VDD−V(A1)) can reach 12 volt or higher for early trigger of the primary ESD protection device M1, as the ESD transient voltage on VH line is still less than 10 volts. In the process respect disclosed in FIG. 5, M1 is an NMOSFET constructed in an isolated pwell, where the pwell and the source node may be pulled to a negative voltage, i.e. below the ground potential, during the ESD event. The gate of the M1 may be electrically coupled to the source either directly or through a resistor element, which is shown by a dash line in FIG. 1. Not shown in FIG. 5, the diode D3 may be a diffusion diode formed by a n+ in an isolated pwell. Alternatively, the diode D3 may be a diffusion diode formed by a p+ in an isolated-grounded-nwell. As a result, the anode of the diode D3 can be pulled down to be lower than the ground potential.

Therefore, this voltage value of (VDD−V(A1)) can early triggers the primary ESD protection device M1 during earlier period the ESD event. Therefore, the ESD protection element as well as the internal circuitry of the integrated circuit can be better protected. For the present invention, neither additional implant nor process complexity is required.

FIG. 3 shows signal variation at respective nodes of the first embodiment during an ESD event. The simulation results are obtained under conditions of (1) 2.5 KV Human Body Model ESD events; (2) 1 nanoFarad chip (power bus) capacitance; (3) R2C2=20 nanoseconds, C2=2 pF, R2=10KΩ; (4) C3=0.2 pF.

It is to be noted that, in an alternative embodiment, M2 can be a PMOSFET with the gate coupled to VH through a resistor and coupled to VL through a capacitor. It is to be noted that, in an alternative embodiment, a diode-configured MOSFET can be also used as the voltage clamping device D3.

Figure 2:
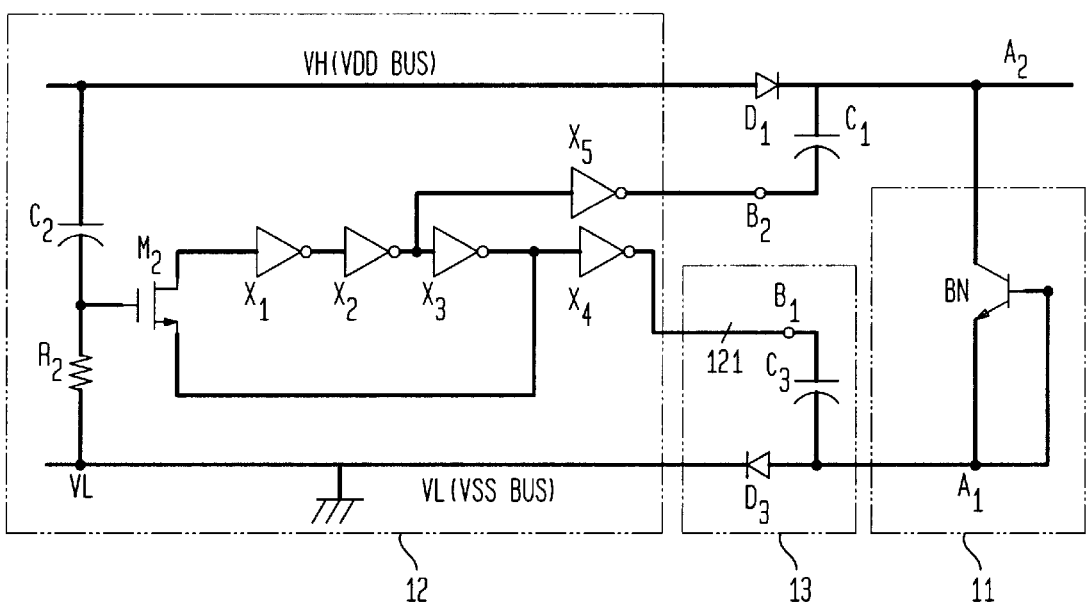
FIG. 2 shows a second preferred embodiment of the invention.
Figure 4:
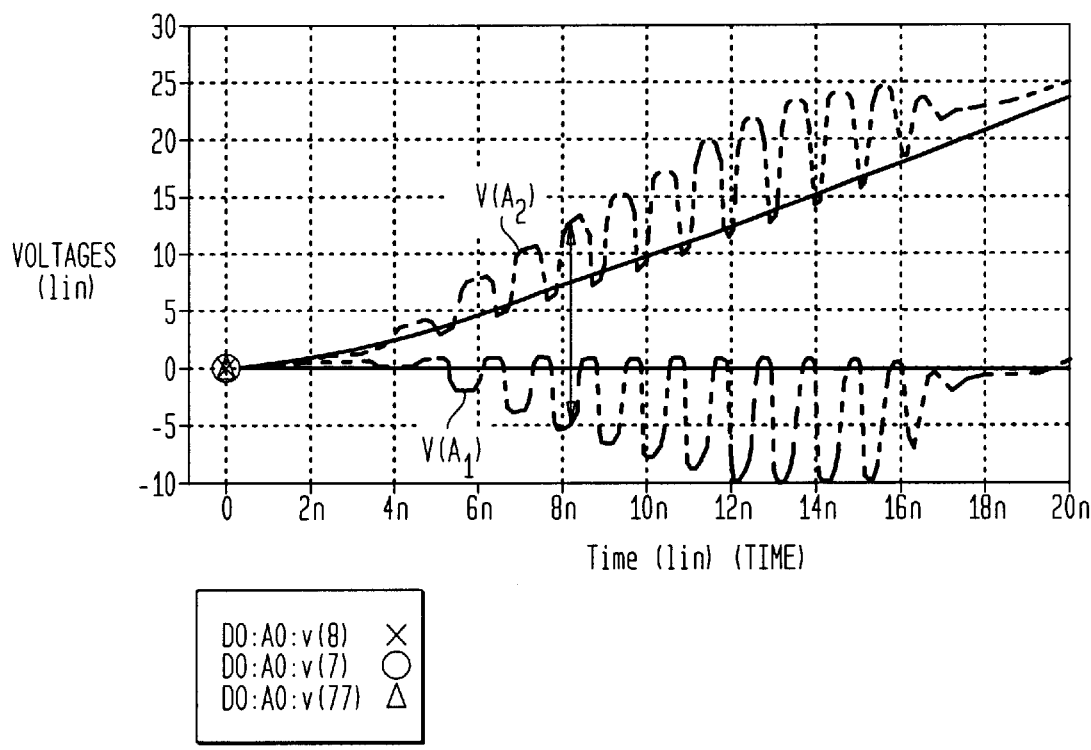
FIG. 4 shows signal variation at respective nodes of the second embodiment of the invention during an ESD event.
Figure 6:
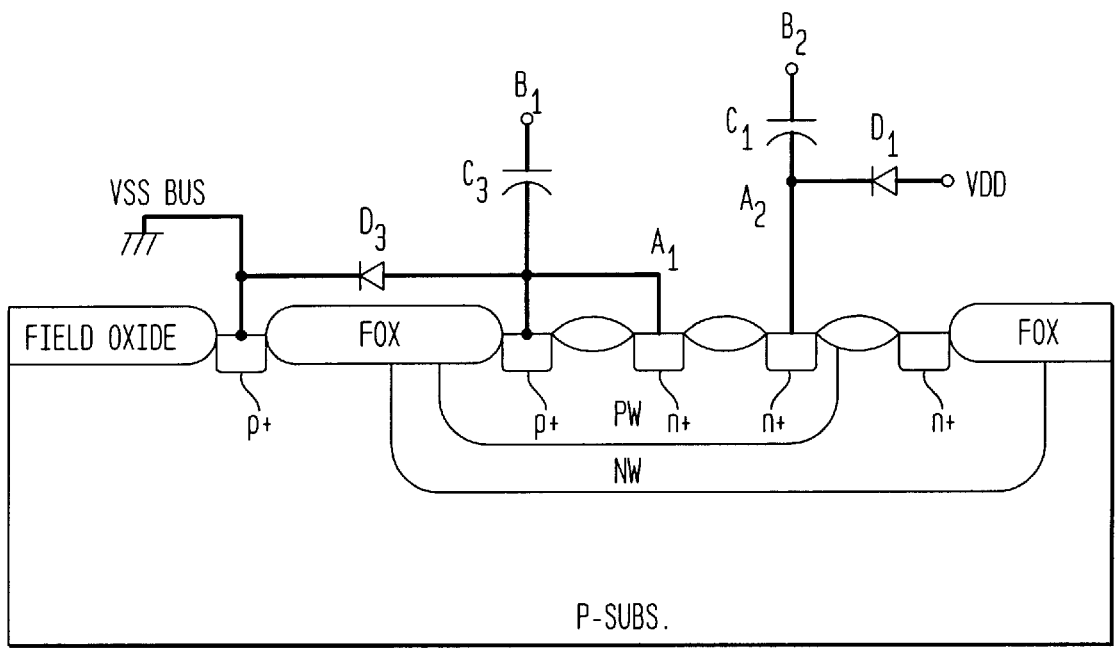
FIG. 6 shows circuit in FIG. 2 in a partial process view and a partial schematic view.

In a second embodiment shown in FIG. 2, the invention, in addition to the voltage pump 13, further includes a second voltage pump which consists of a buffer X5, a capacitor C1 and a voltage clamping device D1 connected as shown. The input of the buffer X5 is coupled to the output of X2. Therefore, as the V(B1) signal goes downward, the V(B2) goes upward, and vice versa. Due to the shown arrangement, during the ESD event, the voltage signal V(A2) at the node A2 is clamped to a value of (VH-0.8v) during the upward transition of the oscillation signal 121. And due to the pumping effect offered by the capacitor C1, the voltage signal V(A2) at the node A2 goes to a value of (VH-0.8v+V(B2)) during the downward transition of the oscillating signal 121. The value of (VH-0.8v+V(B2)) is much higher than the ESD voltage VH. Since V(B1) and V(B2) are substantially out of phase, as V(B2) is rising to push V(A2) to be higher than VDD, V(B1) is falling to push V(A1) to be lower than the ground potential. As shown in FIG. 4, as the transient ESD voltage (VDD-VSS) still less than 10 volt, the difference value of (V(A2)-V(A1)) can reach 12 volt or higher for early trigger of the primary ESD protection device BN. The BN may be an ESD protection device for the power bus, an input pin or an I/O pin. In respect to the process respect, BN is an NPN transistor device constructed in an isolated pwell as depicted in FIG. 6, where the pwell and the emitter may be pulled to a negative voltage below the ground potential during the ESD event. Not shown in FIG. 6, the diode D1 may be a diffusion diode formed by a p+ in an isolated nwell, or alternatively, formed by a n+ in an isolated pwell. The NPN transistor of FIG. 2 may be implemented with a pwell-in-deep-nwell process shown in FIG. 6, where the isolated nwell may be freely pulled up high and the isolated pwell may be freely pulled down to be lower than ground potential.

Alternatively, a transient switch circuit may substitute the oscillation circuit aforementioned. The output signal of the transient switch circuit decreases initially and correspondingly with the ESD event and then increases sharply at a switch point. The voltage pump then pumps the output signal of the transient switch circuit to generate a voltage pulse the magnitude of which is larger than the ESD transient voltage during the ESD event.

I claim:

1. An electrostatic discharge (ESD) protection structure for an integrated circuit constructed on a substrate, comprising:

an ESD protection circuit constructed on the substrate;

a first voltage generator having an output terminal for generating at least a negative voltage pulse in response to an ESD transient voltage during an ESD event;

wherein the output terminal of the first voltage generator is electrically coupled to the ESD protection circuit such that the negative voltage pulse together with the ESD transient voltage triggers the turn-on of the ESD protection circuit.

2. The structure of claim 1, wherein the first voltage generator comprises:

a voltage pump having an input terminal and an output terminal, the voltage pump, responsive to the ESD transient voltage, generates the negative voltage pulse at the output terminal during the ESD event.

3. The structure of claim 2, wherein the first voltage generator comprises an oscillation circuit having an output terminal for generating an oscillation signal during the ESD event, and wherein the input terminal of the voltage pump electrically couples to the oscillation circuit for pumping the oscillation signal to generate the negative voltage pulse during the ESD event.

4. The structure of claim 2, wherein the oscillation circuit comprises:

N inverters serially connected to each other to form a ring oscillator, wherein N is an odd number.

5. The structure of claim 4, wherein the oscillation circuit further comprises a buffer which has an input and an output, the input of the buffer couples to an output terminal of a last one of said N inverters, the output of the buffer defines the output terminal of the oscillation circuit, said buffer boosts the driving strength of the oscillation signal during the ESD event.

6. The structure of claim 2, wherein the voltage pump comprises:

a capacitive device having a first terminal defining the input terminal of the voltage pump, and having a second terminal defining the output terminal of the voltage pump;

a voltage clamping device coupled between said output terminal of the voltage pump and a bus coupled to a reference ground.

7. The structure of claim 3, further comprising a delay-switch operative to turn on the oscillation circuit for at least a time period during the ESD event.

8. The structure of claim 7, wherein the oscillation circuit comprises:

N inverters serially connected to each other, N is odd number, a last one of the N inverters generates the oscillation signal at an output terminal thereof.

9. The structure of claim 8, wherein the delay-switch comprises a switch having an input node, an output node and a control node, wherein said input node connects to the output terminal of the last one of N inverters, said output node connects to an input terminal of a first one of N inverters;

a control signal generator for generating a control signal to said control node of the switch to turn on the switch for at least a time period during the ESD event.

10. The structure of claim 9, wherein said control signal keeps said switch off during normal operation of the integrated circuit.

11. The structure of claim 9, wherein said control signal keeps said switch off during power-on operation of the integrated circuit.

12. The structure of claim 9, wherein said control signal generator includes an RC circuit having a resistor and a capacitor with one common joint terminal generating the control signal, the common joint terminal is connected to said control node.

13. The structure of claim 9, wherein said switch is a MOSFET transistor, and said control node is the gate of the MOSFET transistor.

14. The structure of claim 1, further comprising:

a second voltage generator having an output terminal for generating at least a positive voltage pulse in response to the ESD transient voltage during the ESD event;

wherein the positive and the negative voltage pulse applied across the ESD protection means is larger than the ESD transient voltage applied on the integrated circuit.

15. The structure of claim 14, wherein the second voltage generator comprises:

a second voltage pump having an input terminal and an output terminal, the second voltage pump, responsive to the ESD transient voltage, generates the positive voltage pulse during the ESD event.

16. The structure of claim 15, wherein the second voltage pump comprises:

a second capacitive device having a first terminal defining the input terminal of the second voltage pump, and having a second terminal defining the output terminal of the second voltage pump;

a second voltage clamping device coupled between said output terminal of the second voltage pump and a bus receiving the ESD transient voltage.

17. The structure of claim 6, wherein said voltage clamping device is a diode.

18. The structure of claim 6, wherein said voltage clamping device is a diode-configured MOSFET.

19. The structure of claim 1, wherein the ESD protection circuit is a bipolar transistor.

20. The structure of claim 1, wherein the ESD projection circuit is a MOSFET transistor.

21. The structure of claim 1, wherein the ESD protection circuit is a diode.

22. The structure of claim 1, wherein, during the ESD event, an ESD zapping voltage is applied between a VDD pin and a VSS pin.

23. The structure of claim 1, wherein, during the ESD event, an ESD zapping voltage is applied between an IC pin and a power-bus pin.

24. The structure of claim 23, wherein, said power-bus pin is a VSS bus pin, and a VDD power line is connected to said IC pin via a pull up device, said oscillation circuit is powered by the VDD and VSS.

25. The structure of claim 24, wherein the pull up device is a diode.

26. The structure of claim 24, wherein the pull up device is a PMOSFET.

27. A method for triggering an electrostatic discharge (ESD) protection circuit for an integrated circuit constructed on a substrate, the ESD protection circuit including an ESD protection circuit constructed on the substrate, comprising the following steps:

generating an oscillation signal during an ESD event;

generating, responsive to the oscillation signal, a negative voltage pulses;

applying said negative voltage pulses to trigger the turn-on of the ESD protection circuit.

28. A method for triggering an electrostatic discharge (ESD) protection circuit for an integrated circuit constructed on a substrate, the ESD protection circuit including an ESD protection circuit constructed on the substrate, comprising the following steps:

generating an oscillation signal during an ESD event;

generating, responsive to the oscillation signal, a negative voltage pulses and a positive voltage pulses;

applying said negative and positive voltage pulses across the ESD protection circuit to trigger the turn-on of the ESD protection circuit.

29. An electrostatic discharge (ESD) protection structure for an integrated circuit constructed on a substrate, comprising:

an ESD protection circuit constructed on the substrate;

a voltage generator for generating at least a negative voltage pulse during an ESD event;

wherein the negative voltage pulse triggers the turn-on of the ESD protection circuit.

30. The structure of claim 29, wherein the voltage generator comprises:

a voltage pump having an input terminal and an output terminal, the voltage pump, responsive to the ESD transient voltage, generates the negative voltage pulse during the ESD event.

31. The structure of claim 29, wherein the voltage generator comprises:

an oscillation circuit having an output terminal for generating an oscillation signal during the ESD event;

a voltage pump, responsive to the oscillation signal, for generating the negative voltage pulse during the ESD event.

32. The structure of claim 29, wherein the value of the negative voltage pulse forces a voltage value across the ESD protection circuit to be larger than the ESD transient voltage applied on the integrated circuit during the ESD event.

33. The structure of claim 30, wherein the voltage pump comprises:

a capacitive device having a first terminal defining the input terminal of the voltage pump, and having a second terminal defining the output terminal of the voltage pump;

a voltage clamping device coupled between said output terminal of the voltage pump and a bus coupled to a reference ground.

* * * * *